United States Patent [19]

Winterling et al.

[11] Patent Number: 4,620,058

[45] Date of Patent: * Oct. 28, 1986

[54] SEMICONDUCTOR DEVICE FOR CONVERTING LIGHT INTO ELECTRIC ENERGY

[75] Inventors: Gerhard Winterling, Ottobrunn; Max Königer, Pullach, both of Fed. Rep. of Germany

[73] Assignee: Messerschmitt-Bolkow-Blohm, Fed. Rep. of Germany

[*] Notice: The portion of the term of this patent subsequent to Oct. 28, 1999 has been disclaimed.

[21] Appl. No.: 188,725

[22] Filed: Sep. 19, 1980

[30] Foreign Application Priority Data

Sep. 21, 1979 [DE] Fed. Rep. of Germany ....... 2938260

[51] Int. Cl.$^4$ .......................................... H01L 31/06
[52] U.S. Cl. ................................. 136/258; 136/255; 136/256; 357/30
[58] Field of Search ................ 136/255, 256, 258 PC, 136/258 AM; 357/2, 30

[56] References Cited

U.S. PATENT DOCUMENTS 4,064,521  12/1977  Carlson ................................ 357/2
4,142,195   2/1979  Carlson et al. ....................... 357/15

OTHER PUBLICATIONS

R. Tsu et al, *IBM Technical Disclosure Bulletin*, vol. 21, No. 11, Apr. 1979, p. 4691.

*Primary Examiner*—Aaron Weisstuch
*Attorney, Agent, or Firm*—McGlew & Tuttle

[57] ABSTRACT

A semiconductor device for converting light into electric energy comprises at least one layer of amorphous silicon with a surface thereof which is intended to be exposed to light covered by a cover layer of polycrystalline silicon. The use of the polycrystalline silicon increases the current yield in the blue light range of the solar spectrum. A method of producing such a semiconductor device is also disclosed.

7 Claims, 5 Drawing Figures

Collection Efficiency

Yield of P-I-N Cell as Function of Light Wavelength $\lambda(\mu m)$

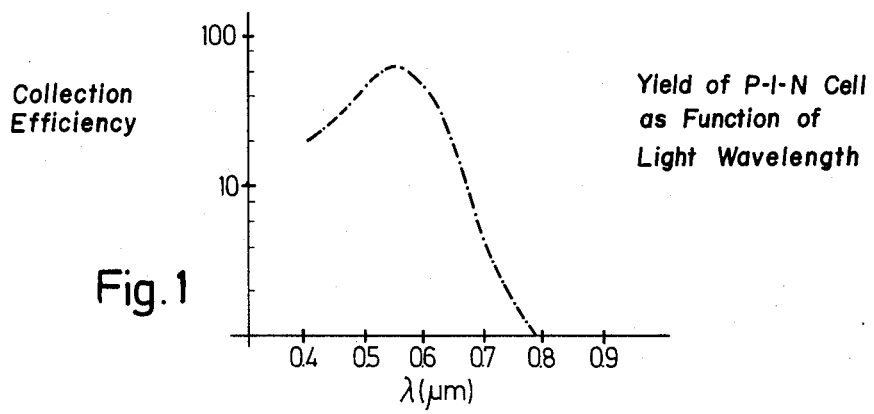
Fig. 1 — Yield of P-I-N Cell as Function of Light Wavelength
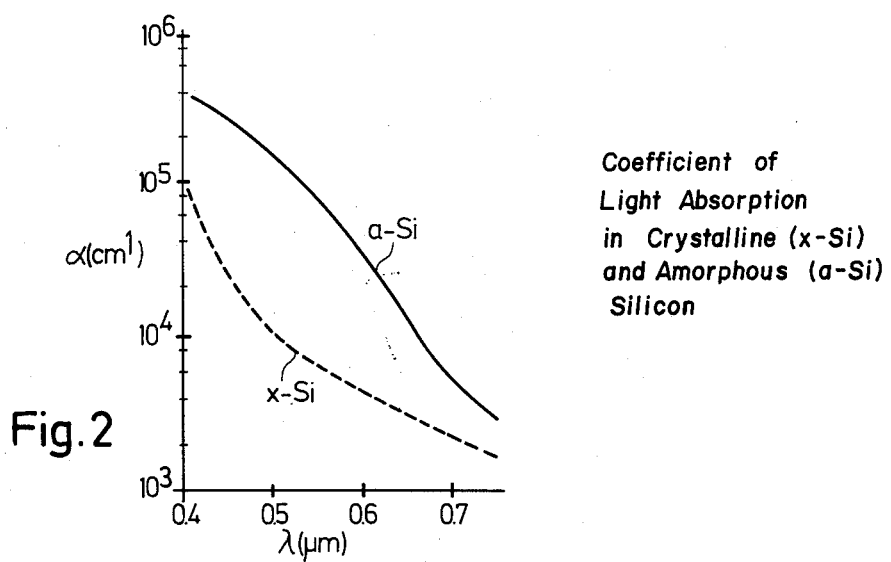
Fig. 2 — Coefficient of Light Absorption in Crystalline (x-Si) and Amorphous (a-Si) Silicon

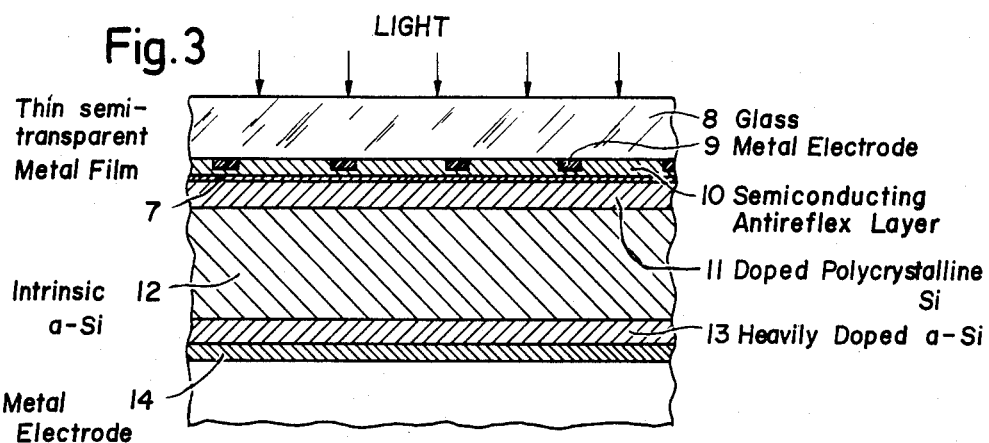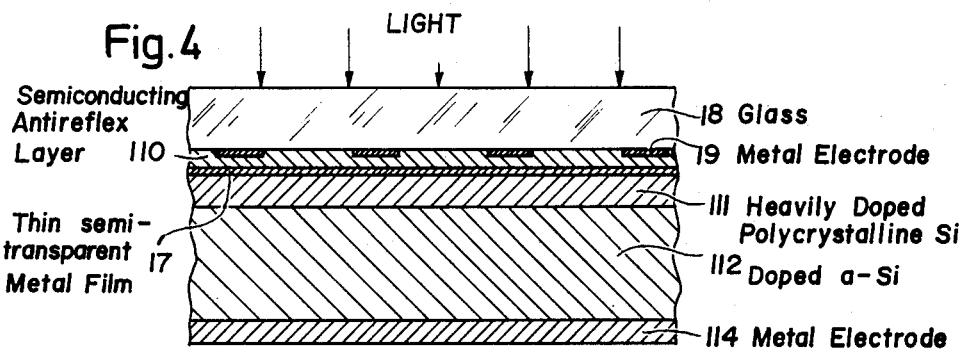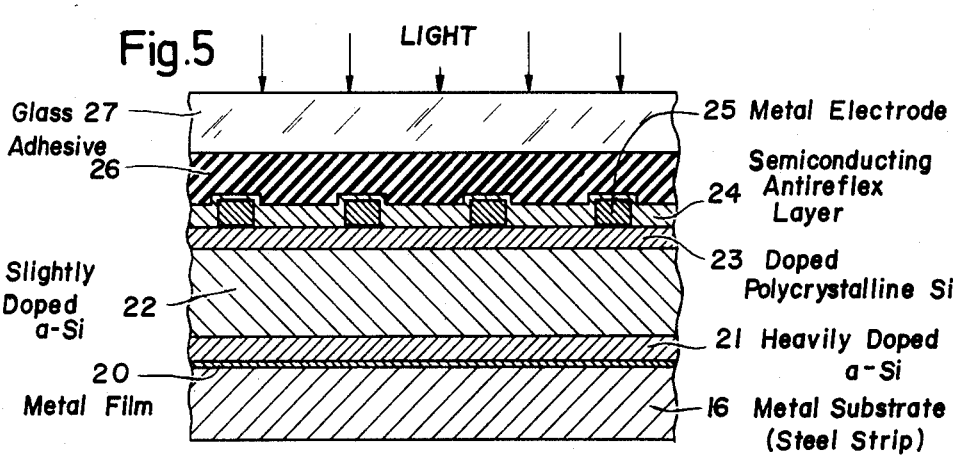

SEMICONDUCTOR DEVICE FOR CONVERTING LIGHT INTO ELECTRIC ENERGY

FIELD AND BACKGROUND OF THE INVENTION

The invention relates in general to semiconductor devices and in particular to a new and useful semiconductor device for converting light into electric energy which includes at least one layer of amorphous silicon.

In semiconductor devices of the mentioned kind, amorphous silicon (a-Si) has proved substantially less expensive in manufacture than mono-or polycrystalline silicon (see D. E. Carlson and C. R. Wronski, *Appl. Phys. Lett.*, 28, 671 (1976)). Because of its considerably higher optical absorption, amorphous silicon is needed only in layers having a thickness of about 1 micron, as compared to 50 to 100 microns with crystalline silicon (see German OS 2,632,987, page 7). Also, a-Si may be deposited directly from the gaseous phase on relatively inexpensive substrates and, in contradistinction to crystalline silicon, does not require any further expensive treatment of the material. The manufacture of such semiconductor devices is comprehensively described in W. E. Spear et al, *Appl. Phys. Lett.*, 28,105 (1976) and in U.S. Pat. No. 4,196,438.

All known a-Si cells with a p-i-n or p-n structure have substantially less degradation than those with m-i-s structures; however they show a drop in collection efficiency upon irradiation with blue-violet light (see FIG. 1). This fact, pointing to a poor conversion of the intense blue part of solar radiation, contributes to the low efficiency of prior art a-Si cells, as compared to crystalline silicon cells.

The poor yield in blue light will be understood while considering that in a-Si, the optical depth of penetration of the blue part of the solar spectrum is smaller than 0.1 micron. The blue light is absorbed substantially in the near-surface a-Si contact layer which is mostly $p^+$-doped and has a thickness of about 500 angstroms. The charge carriers produced there have a shortened life time mostly because of the heavy doping, therefore, they can hardly flow to the diode junction and contribute to the photocurrent.

SUMMARY OF THE INVENTION

The present invention is directed to a substantial elimination of the mentioned disadvantages, namely the low yield of blue light and the lower efficiency connected thereto.

To this end, a cover layer of polycrystalline silicon acting mainly as a window is provided on the amorphous silicon surface exposed to the incident solar radiation.

In contrast to a a-Si, polycrystalline silicon has its Si atoms arranged in a regular way over large regions. Consequently, it absorbs visible light less than a-Si; in particular, less blue light is absorbed in the near-surface Si layer. The optical absorption of polycrystalline Si approximately equals that of monocrystalline Si (See FIG. 2). The light is therefore absorbed more in the volume underlying the polycrystalline Si, i.e., in the slightly doped a-Si. The polycrystalline Si forms with the a-Si that is slightly doped, a heterotransition zone. In addition, the mobility of the charge carriers in the polycrystalline Si is substantially higher than in a-Si. That is why the minority carriers which are produced by the "residual" high absorption in the near-surface layer have a substantially better chance than in the a-Si of reaching the diode junction and contributing to the photocurrent.

In general, the effect of the invention is a quite considerably improved utilization of the intense blue-violet part of the solar spectrum and thus an increased efficiency of the a-Si cells with a p-i-n structure.

Accordingly, an object of the present invention is to provide a semiconductor device for converting light into electric energy, comprising at least one layer of amorphous silicon, a surface of the amorphous silicon which is to be exposed to light being provided with a cover layer of polycrystalline silicon.

Another object of the invention is to provide such a cover layer of polycrystalline silicon which is substantially thinner than the amorphous silicon layer and which is of a thickness in the range of about 0.03 to 0.15 micron.

Another object of the present invention is to provide a method of producing a semiconductor device for converting light into electric energy comprising depositing on a transparent glass substrate, an antireflex layer of semiconducting oxide, depositing on the antireflex layer a polycrystalline layer of silicon and, thereafter depositing an amorphous layer of silicon on the polycrystalline layer of silicon.

The polycrystalline layer of silicon may be deposited first in the form of amorphous silicon which is then treated by heat and the like to crystallize the silicon.

Another object of the invention is to provide such a method wherein additional steps are taken to deposit electrodes in a device and also to deposit a semitransparent metal layer which is thinner than about 50 angstroms between the antireflex layer and the polycrystalline layer.

A still further object of the present invention is to provide a method of producing a semiconductor device for converting light into electric energy, comprising depositing an amorphous silicon layer on a metal substrate, depositing a polycrystalline silicon layer on the amorphous silicon layer, and then depositing an antireflex layer on the polycrystalline layer.

A glass cover plate may be provided over the antireflex layer and the appropriate metal electrodes positioned as required in the device.

Another object of the invention is to provide such a semiconductor device which is simple in design, rugged in construction, and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

In the following the invention is explained in more detail with the reference to the drawings in which:

FIGS. 1 and 2 are graphs showing the light converting characteristics of various materials utilized in the invention;

FIGS. 3 and 4 are cross sectional views of structures of a-Si semiconductor devices with p-i-n or p-n junctions, transparent glass being the starting substrate; and FIG. 5 is a view similar to FIGS. 3 and 4 of a structure with a metal substrate.

DESCRIPTION OF THE PREFERRED EMBODIMENTS

The structures shown in FIGS. 3 and 4 closely resemble each other. Only some features of these structures are described separately in the literature; see U.S. Pat. No. 4,196,438, particularly for FIG. 3. In the shown structures, the visible light of wavelengths λ greater than or approximately equal to 0.45 microns, is absorbed mainly in the a-Si layer 12, 112. In the p-i-n structure (FIG. 3) the layer 12 is intrinsic, thus slightly of the n-type. In the p-n structure (FIG. 4), the a-Si layer 112 is doped according to a gradient, the doping at the p-n junction being very small and increasing strongly only in the proximity of the metal electrode 114. The p-i-n structure may thus be considered a limiting case of a p-n structure having a special doping gradient. Layer 112 may be of the p-type or the n-type, and the doping of the polycrystalline layer 111 must then be complementary. Layer 111 is more heavily doped and its thickness is 0.15 microns at most. The average grain size parallel to the surface in the polycrystalline Si layer should be larger, by factor of 2, than the thickness of the polycrystalline Si layer.

It is further to be taken into account that a heavy doping strongly reduces the life time of the minority carriers. The high doping concentration, which is important for establishing a satisfactory ohmic contact, should therefore be reduced to a thin layer close to the surface, having a maximum thickness of about 400 angstroms.

The layer arrangements can be produced in two basically different ways:

A. Transparent glass 8 and 18 is used as the starting substrate, as shown in FIGS. 3 and 4, respectively. On this substrate, which withstands temperatures up to 800° C. and preferably is made of quartz glass or vycor glass, an antireflex layer 10, 110 of a semiconducting oxide is deposited. This is followed by a polycrystalline Si layer 11, 111 having a maximum thickness of 0.15 microns, which may be produced in different ways:

(a) by precipitating Si from the gaseous phase, for example by means of a glow discharge, or by a thermal decomposition of $SiH_4$, or by sputtering on the hot glass substrate at temperatures higher than about 600° C.;

(b) by depositing a-Si at lower substrate temperatures with a following crystallization which is effected either by heating up to a temperature higher than 680° C., or by bombardment with intense laser pulses;

(c) by a process conducted at temperatures lower than 650° C. This last process is as follows: At temperatures below 300° C., a very thin, semitransparent metal layer 7,17, preferably of aluminum and thinner than about 50 angstroms, is deposited by evaporation on the glass substrate 8, 18 coated with the antireflex layer 10, 110. Thereon, an Si layer 11, 111 of a thickness between 1,000 angstroms and 2,000 angstroms is deposited, also at relatively low temperatures of less than 300° C. Upon heating this sandwhich structure to temperatures between 450° C. and 650° C., the Si crystallizes to a granular structure with a strong p-type conductivity, due to the incorporated aluminum. The surface of this layer is strongly enriched with aluminum. To produce a p-n junction thereon, it is advantageous to remove the strongly Al-enriched surface layer by sputter etching followed by deposition of the amorphous silicon.

It should be noted quite generally with regard to process c, that the thin aluminum layer 7, 17 not only supports the process of crystallization of Si but also improves the ohmic contact between the Si layer 11, 111 and the adjacent semiconducting oxide of the antireflex layer 10, 110, and contributes to a reduction of the series resistance.

Prior to depositing an approximately 1 micron thick a-Si layer 12, 112, it has proved advantageous to expose the polycrystalline Si layer, at a medium temperature of about between 150° C. and 450° C., to a hydrogen plasma, to saturate remaining dangling bonds. The a-Si layer 12, 112 is deposited at substrate temperatures between 200° C. and 400° C., for example by decomposing $SiH_4$ in a glow discharge, or by reactive sputtering of Si in a hydrogen atmosphere. To deposit the heavily doped a-Si layer 13, if a glow discharge is used, it is advisable to admix to the initial gas doping gases D, such as $B_2H_6$ or $AsH_3$ or $PH_3$, in a proportion by volume of $D/SiH_4 = 10^{-4}$ to $5 \times 10^{-3}$. With D being $B_2H_6$, a p-type layer is obtained, and $AsH_3$ provides an n-type layer. As a rule, the thickness of layer 13 is about 500 angstroms. Layer 13 is then coated at its rearside by non-transparent metal electrode 14 which is normally applied by metal evaporation.

To reduce the surface resistance, that is, improve the collecting of photoelectrically produced charge carriers at the side of the light incidence, it is frequently necessary to provide a comb-like metal electrode 9, 19 at the interface between the glass substrate 8, 18 and the semiconducting antireflex layer 10, 110.

B. The starting substrate may also be a metallic substrate 16 as shown in FIG. 5. In such a case, the described structure is built up in the reverse order of process A. On the metal substrate 16, which preferably is made from a thin strip of high-grade steel and whose surface was cleaned in glow discharge, a heavily doped a-Si layer 21 is deposited in a thickness of about 500 Angstroms, at a temperature between 200° C. and 400° C. This deposition is usually effected by a glow discharge or by sputtering. To improve the adhesion of the a-Si layer and to obtain a satisfactory ohmic contact, it is advantageous to apply to the metal substrate 16 a thin metallic film 20, preferably of chromium, deposited by evaporation.

The active layer proper, i.e., the a-Si layer 22 having a thickness of about 1 micron, is also deposited at substrate temperatures between 200° C. and 400° C., preferably in the way mentioned above. If the a-Si layer 21 is heavily p-doped, only a slight p-type conduction is to be provided for layer 22. If layer 21 is strongly of the n-type, it is sufficient to provide a non-doped, intrinsic a-Si layer 22. Then, in both instances, the junction is located between layer 22 and the heavily doped polycrystalline Si layer 23 which again is deposited in the above-described manner and has a thickness of about 0.1 micron.

Layer 23 may also be re-crystallized in accordance with a method which is used for annealing defects in Si wafers, and is known in the literature as "annealing by laser irradiation". Since, in the present example, only the uppermost a-Si layer 23 is to be crystallized laser radiation of small depth of penetration, less than 0.1 micron, must be used, thus blue or violet laser light. Further, it is advisable to use very short laser pulses with a maximum pulse duration of about $10^{-8}$ second, to heat only the uppermost a-Si layer. Advantageously, the substrate with the a-Si layer will have a temperature of about 350° C., to keep the mechanical stresses caused by the laser bombardment small. It is also advantageous to expose the uppermost layer 23, after the crystallization, to a hydrogen plasma which is produced by a glow discharge in a hydrogen atmosphere.

Metal electrodes 25 in a comb-like arrangement are then placed on the uppermost Si layer 23, serving the purpose of collecting the photocurrent. A semiconducting antireflex layer 24, preferably having an optical thickness of λ/4 is intended to reduce losses for reflection. Metal electrodes 25 must be sufficiently closely spaced from each other, in order not to exceed a tolerable value of the surface resistance of layers 23 and 24.

The application of antireflex layer 24 completes the build-up of the "bare cell". A transparent layer of adhesive 26 and a glass cover 27 or a thin transparent glass layer are then applied to protect the sensitive structure.

While specific embodiments of the invention have been shown and described in detail to illustrate the application of the principles of the invention, it will be understood that the invention may be embodied otherwise without departing from such principles.

What is claimed is:

1. A semiconductor device for the conversion of incident solar radiation into electrical energy, comprising an amorphous silicon body having a surface to be exposed to the incident radiation, and a cover layer or doped semiconductor material which is arranged on the surface of the amorphous silicon body to be exposed to incident radiation, the amorphous silicon body being one of relatively slightly doped, oppositely doped, or intrinsic amorphous silicon adjacent its surface to be exposed and forming with the cover layer, a heterotransition zone, the cover layer consisting of a polycrystalline silicon layer obtained by deposition from a gaseous phase comprising a silicon containing gas and having a thickness of 0.15 micron at most and an average grain size parallel to the surface which is larger than said thickness by a factor of about two, resulting directly from the deposition process, whereby even the blue-violet part of solar radiation is absorbed by the amorphous silicon body adjacent its incident surface, thereby increasing the efficiency of conversion of the solar radiation into electrical energy.

2. A semiconductor device according to claim 1, wherein the cover layer of polycrystalline silicon is substantially thinner than the amorphous silicon body, the cover layer having a thickness of about 0.03 to 0.15 micron.

3. A semiconductor device according to claim 1, further including a semiconductor antireflex layer over said cover layer of polycrystalline silicon, a layer of transparent glass over said antireflex layer and at least one metal electrode embedded in said antireflex layer.

4. A semiconductor device according to claim 3, including a semitransparent metal film layer between said antireflex layer and said polycrystalline silicon cover layer, said polycrystalline cover layer being nearly doped, said amorphous silicon body being intrinsic or slightly doped and including a heavily doped portion on the side of said amorphous silicon body away from said polycrystalline silicon with a metal electrode on said heavily doped amorphous silicon portion.

5. A semiconductor device according to claim 3, further including a semitransparent metal film layer between said antireflex layer and said polycrystalline silicon cover layer, said polycrystalline layer being heavily doped, said amorphous silicon body being either of oppositely doped or intrinsic amorphous silicon having a doping gradient, with a metal electrode connected to said amorphous silicon body.

6. A semiconductor device according to claim 1, including a semiconductor antireflex layer over said cover layer of polycrystalline silicon, a layer of adhesive on said antireflex layer, a transparent glass layer on said layer of adhesive, and at least one metal electrode embedded in said antireflex layer, said amorphous silicon body having a slightly doped portion adjacent said polycrystalline silicon cover layer and a heavily doped portion spaced from said polycrystalline silicon cover layer.

7. A semiconductor device according to claim 6, further including a thin metal film contacting said heavily doped portion of said amorphous silicon body and a metal substrate contacting the other side of said thin metal film.

* * * * *